US008198787B2

(12) United States Patent
Nakayama

(10) Patent No.: US 8,198,787 B2
(45) Date of Patent: Jun. 12, 2012

(54) ULTRASONIC PROBE WITH ADHESIVE PROTRUSION PREVENTIVE STRUCTURE

(75) Inventor: Ryuichi Nakayama, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 449 days.

(21) Appl. No.: 12/503,613

(22) Filed: Jul. 15, 2009

(65) Prior Publication Data

US 2010/0013358 A1 Jan. 21, 2010

(30) Foreign Application Priority Data

Jul. 18, 2008 (JP) ................................ 2008-186969

(51) Int. Cl.
*H01L 41/08* (2006.01)
*H04R 17/00* (2006.01)

(52) U.S. Cl. ......................... 310/334; 600/437; 600/459

(58) Field of Classification Search .................. 310/334; 600/437, 459

See application file for complete search history.

(56) References Cited

FOREIGN PATENT DOCUMENTS

| | | | | |
|---|---|---|---|---|
| JP | 7-236638 | A | | 9/1995 |
| JP | 8-79894 | A | | 3/1996 |
| JP | 08079894 | A | * | 3/1996 |
| JP | 2007307288 | A | * | 11/2007 |

* cited by examiner

*Primary Examiner* — J. San Martin
(74) *Attorney, Agent, or Firm* — Sughrue Mion, PLLC

(57) ABSTRACT

An ultrasonic probe, in which a thick adhesive layer is not formed directly under the piezoelectric element and the adhesive is prevented from covering an electrode portion of a side face of the piezoelectric element. The ultrasonic probe includes: a main backing material having a curved surface; a flexible auxiliary member having a first surface bonded onto the curved surface of the main backing material by using an adhesive; and an array of piezoelectric elements arranged on a second surface of the flexible auxiliary member, wherein at least one of side edges of a bonding surface between the flexible auxiliary member and the main backing material is formed with a recessed area for allowing the adhesive, which has protruded when bonding the flexible auxiliary member onto the main backing material by using the adhesive, to escape thereinto.

8 Claims, 11 Drawing Sheets

ULTRASONIC PROBE WITH ADHESIVE PROTRUSION PREVENTIVE STRUCTURE

CROSS-REFERENCE TO RELATED APPLICATION

The present application claims priority from Japanese Patent Application No. 2008-186969 filed on Jul. 18, 2008, the contents of which are incorporated herein by reference in their entirety.

BACKGROUND OF THE INVENTION

1. Field of the Invention

The present invention relates to an ultrasonic probe to be used in an ultrasonic diagnosis apparatus or an ultrasonic endoscope, and in particular to an ultrasonic probe adapted to prevent an adhesive, which is used in manufacturing the ultrasonic probe, from protruding to an electrode portion and damaging the electric connection.

2. Description of a Related Art

In medical fields, various imaging technologies have been developed in order to observe the interior of an object to be inspected and perform diagnosis. In particular, ultrasonic imaging for acquiring internal information of the object by transmitting and receiving ultrasonic waves has been utilized in a wide range of departments including not only the fetal diagnosis in the obstetrics, but also gynecology, circulatory system, digestive system, and so on, as a safe imaging technology enabling image observation in real time and accompanying no exposure to radiation.

The ultrasonic imaging is an image generation technology utilizing the nature of ultrasonic waves that the ultrasonic waves are reflected at a boundary between regions with different acoustic impedances. An ultrasonic diagnosis apparatus utilizing the ultrasonic imaging is provided with an ultrasonic probe to be used in contact with an object to be inspected, or an ultrasonic probe to be used by being inserted into an abdominal cavity of the object. Moreover, an ultrasonic endoscope comprising a combination of an endoscope for optically observing the interior of the object and an ultrasonic probe for intracavity has been also used.

As an ultrasonic transducer for transmitting and receiving ultrasonic waves in the ultrasonic probe, a piezoelectric vibrator having electrodes formed on both ends of a piezoelectric material is usually used. When a voltage is applied to the electrodes of the vibrator, the piezoelectric material expands and contracts to generate ultrasonic waves. Furthermore, a plurality of vibrators are one-dimensionally or two-dimensionally arranged and driven by drive signals with a predetermined delay given thereto, and thereby, an ultrasonic beam can be formed toward a desired direction. On the other hand, the vibrators expand and contract by receiving propagating ultrasonic waves to generate electric signals. These electric signals are used as reception signals of the ultrasonic waves.

In particular, in the ultrasonic probe to be used by being inserted into an abdominal cavity, there is a need to narrow and soften an insertion tube for feeding the ultrasonic probe to near an affected part and also to miniaturize constituent elements arranged at the tip part of the insertion tube.

FIG. 11 is a cross sectional view showing an internal structure of a conventional ultrasonic probe. A vibrator comprises a piezoelectric material, and upper and lower electrodes which are formed in the upper and lower sides of the piezoelectric material by coating. A backing material is provided on one surface of the vibrator, while on the other surface, an acoustic lens is provided via an acoustic matching layer. The vibrator and the backing material are bonded to each other with an adhesive such as an epoxy resin.

FIG. 12 is an enlarged view of a portion "A" of FIG. 11, and shows the adhesive flowing to the side portion of the vibrator and the backing material. The flow of the adhesive occurs by pressing the vibrator and the backing material when bonding and fixing the both to each other. This pressing eliminates mixing of a foreign matter such as air and enables uniform bonding. However, the adhesive may protrude to the side portion and cover the electrode due to the pressing. In this case, even if wiring electrodes such as lead wires or a FPC (flexible printed circuit board), which transfer signals from a drive unit, are provided, electrical coupling cannot be obtained between the wiring electrode and the electrode of the vibrator. It is therefore necessary to make electric connection after removing the adhesive, or to reject such an ultrasonic probe as a defective one.

Japanese Patent Application Publication JP-A-8-79894 discloses an ultrasonic probe capable of preventing an adhesive from flowing to the periphery. According to JP-A-8-79894, as shown in FIG. 13, a groove for retaining the adhesive therein is provided in a peripheral portion of a backing material so as to lead the adhesive, which has overflowed when bonding the backing material and the electrode surface to each other, into the groove. This can prevent the adhesive from flowing to the periphery. Moreover, JP-A-8-79894 describes that if especially the distance between the groove and the edge of the backing material, the groove width, and the groove depth are set to a half of a wavelength of an ultrasonic wave, then the sound absorptivity is not to be degraded even if the adhesive fills in this groove and is solidified therein.

By the way, in order to fabricate a convex-type ultrasonic probe, a plurality of vibrators (piezoelectric elements) needs to be arranged as an array on the curved surface of a cylindrical backing material, for example. However, it is difficult to prepare the piezoelectric elements one by one, and then arrange a plurality of piezoelectric elements at fixed intervals in a primary arranging direction (azimuth direction) on the cylindrical curved surface, and bond and fix them. Then, as shown in FIGS. 14A-14C, there is used a technology of manufacturing an ultrasonic probe by utilizing a thin and tabular auxiliary member (also referred to as a "thin backing material") formed of a backing material and having flexibility. First, a tabular piezoelectric element is bonded onto the auxiliary member. Then, the tabular piezoelectric element is cut in an elevation direction, which is perpendicular to the azimuth direction, and divided to arrange a plurality of piezoelectric elements in an array on the auxiliary member (FIG. 14A). The auxiliary member, on which the plurality of piezoelectric elements are arranged, is bonded onto the curved surface of the cylindrical backing material by using an adhesive (FIG. 14B). As a result, an array of elements at fixed intervals can be achieved (FIG. 14C). As the size of the ultrasonic probe is reduced, the arrangement of the piezoelectric elements one by one becomes a finer and more precise task, and therefore, this technology is effective.

In the conventional ultrasonic probe, although the width (length in the elevation direction perpendicular to the azimuth direction) of the cylindrical backing material is usually larger than that of the thin backing material, both widths are becoming equal to each other as the size of the ultrasonic probe itself is reduced. Consequently, the protrusion of the adhesive in bonding the thin backing material to the cylindrical backing material has been a problem in manufacturing the ultrasonic probe. Namely, if the amount of the adhesive used in bonding the thin backing material to the cylindrical backing material is insufficient, the sound absorption effect of the backing material cannot be sufficiently obtained, which adversely affects the acoustic performance of the finished ultrasonic probe. On the other hand, if the adhesive is used in excess, then the adhesive is likely to protrude because the ultrasonic probe is small, which leads to a problem that the side face is covered with the adhesive as shown in FIG. 14C. In particular, if the protruded adhesive climbs up the piezoelectric element side above the bonding surface, i.e., the side face of the thin backing material or the piezoelectric elements, then the side face may be covered with the adhesive to cause failure of electric connection because this is the place where the wiring electrode for transferring the electric signal from the drive unit and the electrode of the piezoelectric element are electrically connected to each other later.

FIG. 15 is an assembly view of a convex-type ultrasonic probe formed with an adhesive retaining groove directly under a piezoelectric element. In the ultrasonic probe as shown in FIG. 15, the groove for retaining the adhesive therein as taught in JP-A-8-79894 is applied to the convex-type ultrasonic probe. The adhesive retaining groove is formed within a curved surface of a cylindrical backing material, to which a thin backing material having a piezoelectric element array mounted thereon is bonded. The adhesive retaining groove is formed in the azimuth direction at the position close to the side edge in the bonding surface.

Moreover, Japanese Patent Application Publication JP-A-7-236638 discloses that, as shown in FIG. 16, vibrators are fixed to an auxiliary member formed of a backing material, and an auxiliary-member fitting groove and drain ditches for allowing an excess adhesive to escape therein are provided in a fixation material formed of a backing material in advance. Since the fitting groove having the same width as that of the vibrator is formed in the fixation material, the alignment between the auxiliary member having the vibrator mounted thereon and the fixation material can be automatically achieved when the auxiliary member is fitted into the fitting groove of the fixation material. Furthermore, the adhesive-escaping drain ditches, which are formed in the azimuth direction at both ends of the fitting groove, prevent an excess adhesive from protruding. In addition, in the fixation material, a chamfered surface is formed in a curved portion such that the bending angle of an FPC for leading wirings from piezoelectric elements is devised to be relaxed so as not to cause damages such as disconnection.

The above-described conventional examples prevent the adhesive from protruding to the side face, thereby preventing the electrode of the piezoelectric element from being isolated from the wiring electrode. However, in both examples, the drain ditch, into which the adhesive escapes, is positioned directly under the piezoelectric element, and therefore, an adhesive layer, which is partially thick by the amount of the width of the groove, is formed in the vibration direction of the piezoelectric element. Since the sound attenuation capability of the adhesive is small as compared with that of the backing material, the thick adhesive layer formed in the groove directly under the piezoelectric element will degrade the performance of the probe. Moreover, if a bubble enters the groove, an air region will be included between the piezoelectric element and the backing material, which has a more unfavorable effect on the acoustic performance of the ultrasonic probe.

On the other hand, if the volume of the drain ditch is small, the adhesive that has not been stored into the groove will protrude to the side face, which may consequently cause failure of electric connection between an electrode of the piezoelectric element and the wiring electrode for transferring a signal from the drive unit, as is conventional. Since a length in the elevation direction has been reduced as advances have been made in miniaturizing the ultrasonic probe, the area causing an acoustic loss is required to be reduced as much as possible. Therefore, it is, of course, better that there is no thick adhesive layer stuck in the groove directly under the piezoelectric element.

SUMMARY OF THE INVENTION

The present invention has been achieved in view of such problems. It is an object of the present invention to provide an ultrasonic probe manufactured by bonding a flexible auxiliary member with an array of piezoelectric elements formed thereon to a main backing material by using an adhesive, in which a thick adhesive layer is not formed directly under the piezoelectric element and the adhesive is prevented from covering an electrode portion of a side face of the piezoelectric element.

In order to achieve the above-described object, an ultrasonic probe according to one aspect of the present invention comprises: a main backing material having a curved surface; a flexible auxiliary member having a first surface bonded onto the curved surface of the main backing material by using an adhesive; and an array of piezoelectric elements arranged on a second surface opposite to the first surface of the flexible auxiliary member, wherein at least one of side edges of a bonding surface between the flexible auxiliary member and the main backing material is formed with a recessed area for allowing the adhesive, which has protruded when bonding the flexible auxiliary member onto the main backing material by using the adhesive, to escape thereinto.

According to the one aspect of the present invention, even if an excess adhesive has protruded when bonding a flexible auxiliary member, on which an array of piezoelectric elements is mounted, onto a main backing material, the protruded adhesive escapes into the recessed area (adhesive retaining groove) formed in at least one of side edges of the bonding surface. Therefore, a thick adhesive layer or a region of air having a different sound attenuating capability does not exist directly under the piezoelectric element, thereby preventing an additional acoustic loss. As a result, a small but high-performance ultrasonic probe can be obtained. Moreover, since the protruded adhesive will not reach the side face of the piezoelectric element, the protruded adhesive does not interfere with electric connection between a wiring electrode and an electrode of the piezoelectric element. As a result, a high quality ultrasonic probe can be achieved.

For example, the adhesive retaining groove can be formed by chamfering a ridge line portion of the curved surface of the backing material. In the case where the chamfering is employed, an adhesive layer located directly under the piezoelectric element can be made thinner. Moreover, since the chamfered surface together with a projecting lower face of the flexible auxiliary member forms a recess having a wall surface, which is inclined downward (in the direction opposite to the transmission direction of ultrasonic waves), in the side face of the bonding surface, the protruded adhesive is easily led downward from the bonding surface.

Furthermore, at least one slot for escaping the adhesive may be formed on the curved surface of the main backing material in the generatrix direction (elevation direction). At this time, the width of the adhesive escaping slot is preferably set equal to or less than an interval of the piezoelectric elements such that the position of the adhesive escaping slot may not come directly under the piezoelectric element when the flexible auxiliary member is bonded to the main backing material. By causing the adhesive escaping slot formed on the curved surface of the main backing material to extend to the side face of the main backing material, the adhesive is ejected to the adhesive retaining groove formed in the side portion of the main backing material. It is therefore possible to prevent the adhesive from protruding to the side face of the piezoelectric element, thereby preventing the adhesive from interfering with the electric connection. The adhesive escaping slot may be formed in the first surface of the flexible auxiliary member. Also at this time, the width thereof is preferably set equal to or less than an interval of the piezoelectric elements such that the position of the adhesive escaping slot may not come directly under the piezoelectric element.

DESCRIPTION OF THE PREFERRED EMBODIMENTS

Figure 1:
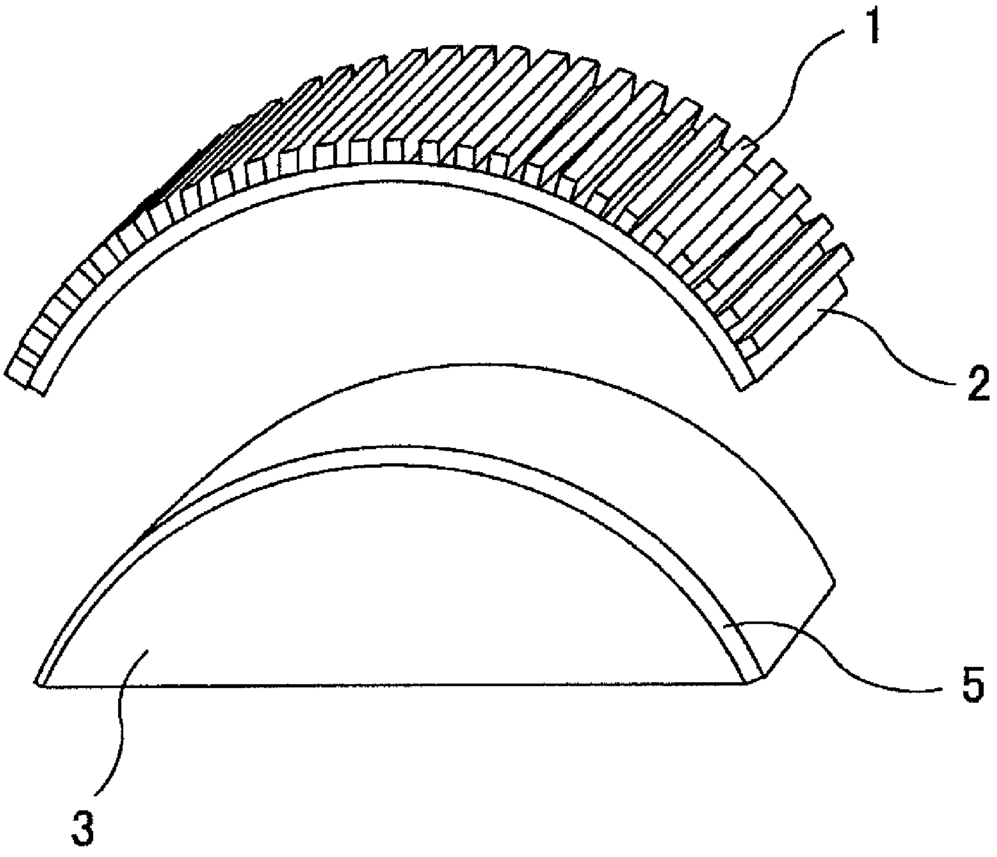
FIG. 1 is an assembly view of an ultrasonic probe according to a first embodiment of the present invention.

Hereinafter, embodiments of the present invention will be described in detail with reference to the accompanying drawings. The same reference numeral is given to the same constituent element to omit the duplicated description.

Figure 2:
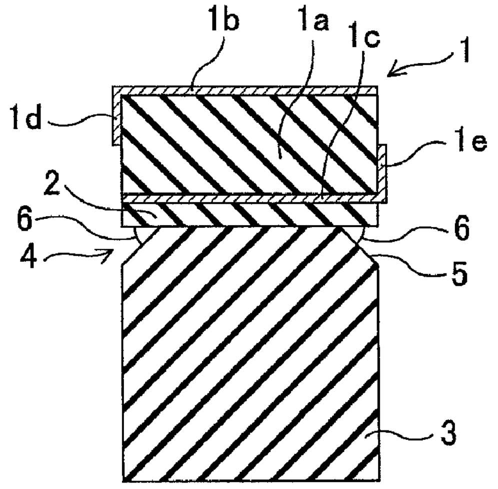
FIG. 2 is a cross sectional view showing an internal structure of the ultrasonic probe according to the first embodiment of the present invention.

FIG. 1 is an assembly view of an ultrasonic probe according to a first embodiment of the present invention, and FIG. 2 is a cross sectional view showing an internal structure of the ultrasonic probe according to the first embodiment.

As shown in FIG. 1, the ultrasonic probe according to this embodiment includes: an array of a plurality of piezoelectric elements (also referred to as piezoelectric vibrators or ultrasonic transducers) 1; a flexible auxiliary member (hereinafter, also referred to as a "thin backing material") 2 having a first surface (lower surface) and a second surface (upper surface), in which these piezoelectric elements 1 are arranged as an array and bonded onto the second surface thereof; and a main backing material 3 having a curved surface, to which the first surface of the thin backing material 2 is bonded. The main backing material 3 is also referred to as a "cylindrical backing material" because the curved surface serving as a bonding surface is a part of a cylindrical surface. Although omitted in FIG. 1, at least one acoustic matching layer, an acoustic lens and so on are provided according to need on the piezoelectric element 1.

As shown in FIG. 2, in the piezoelectric element 1, electrodes 1*b* and 1*c* are formed in the upper surface and lower surface of a piezoelectric material 1*a*, respectively, and connection terminal portions 1*d* and 1*e* of the electrodes to be connected to wiring electrodes for transferring a signal from the drive unit are provided on both side faces of the piezoelectric material 1*a*, respectively.

In this embodiment, piezoelectric ceramic is used as a material for the piezoelectric material 1*a*. Since the piezoelectric ceramic has a high electric/mechanical energy conversion efficiency, the piezoelectric ceramic can generate strong ultrasonic waves capable of reaching the depth of the human body and also has a high receiving sensitivity. As the specific material, PZT (Pb (lead) zirconate titanate: Pb (Ti, Zr)$O_3$), a material of a modified composition having a perovskite-type crystal structure similar to PZT, a material usually called a relaxer-type material, or the like can be used.

The thin backing material 2 contains resin, rubber, or the like. Moreover, the main backing material 3 contains a material having a large sound attenuation characteristic, such as an epoxy resin containing ferrite powder, metal powder, or PZT powder, or a rubber containing ferrite powder, and promotes attenuation of unnecessary ultrasonic waves generated from the plurality of piezoelectric elements 1.

At least one ridge line portion having an arc shape in the curved surface of the main backing material 3 is chamfered to form a chamfered surface 5. As shown in FIG. 2, the thin backing material 2 and the main backing material 3 are bonded to each other by using an adhesive such as an epoxy resin, and a recessed area (adhesive retaining groove) 4 sandwiched by the lower face of backing material 2 and the chamfered surface 5 is formed along the ridge line of each side edge of the bonding surface. When bonding the thin backing material 2 and the main backing material 3 to each other by using an adhesive in order to manufacture an ultrasonic probe, the adhesive 6 overflowing from the bonding surface will seep and accumulate into the adhesive retaining groove 4 on each side edge of the bonding surface. This allows the protruded adhesive 6 to escape into the adhesive retaining groove 4.

If the volumetric capacity of the adhesive retaining groove 4 formed by the chamfered surface 5 is set sufficiently large as compared with the area of the bonding surface, the adhesive 6 seeping from the bonding surface can be prevented from overflowing from the adhesive retaining groove 4. Therefore, the bonding performance of the adhesive will not be degraded by reducing the amount of adhesive too much for fear of excess adhesive. Moreover, also when the excess adhesive 6 is too much and overflows from the adhesive retaining groove 4, the adhesive will not climb upward from the adhesive retaining groove 4 due to the shape of the adhesive retaining groove 4. Therefore, there is no possibility for the adhesive 6 to reach to the side face of the piezoelectric element 1, in which the connection terminal portions 1*d* and 1*e* are arranged, nor to reach to the side face of the thin backing material 2 to degrade the electric connection between the connection terminal portions 1*d* and 1*e* and the wiring electrode. Furthermore, the adhesive retaining groove 4, into which the adhesive 6 accumulates, can be formed to prevent the performance of the ultrasonic probe from degrading, by suitably selecting the chamfering angle or depth such that the region located directly under the piezoelectric element 1 is made small.

Figure 3A:
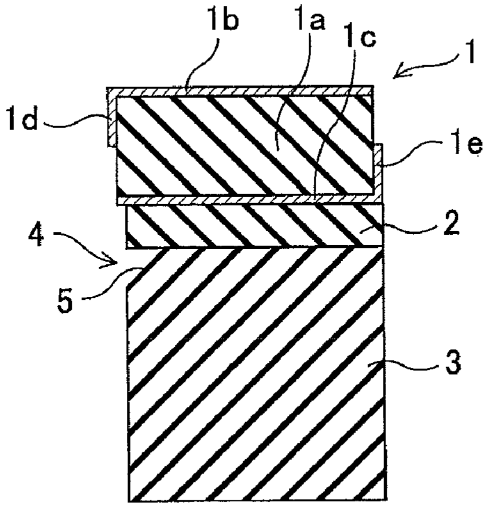
FIGS. 3A and 3B are cross sectional views showing an internal structure of an ultrasonic probe according to variations of the first embodiment of the present invention.
Figure 3B:
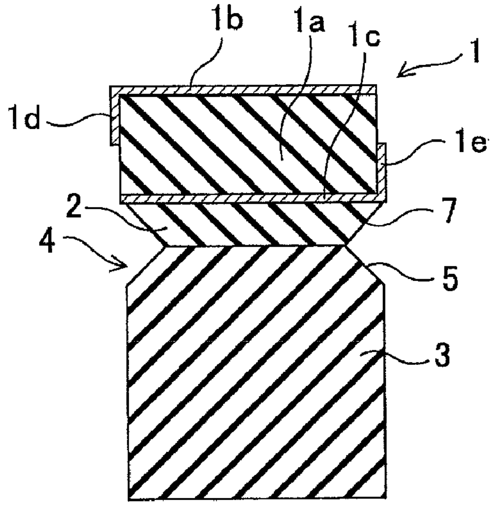

FIGS. 3A and 3B are cross sectional views showing an internal structure of an ultrasonic probe according to variations of the first embodiment. FIG. 3A illustrates an ultrasonic probe in which the chamfered surface 5 is formed only at one of side edges instead of both side edges of the curved surface of the main backing material 3. If the amount of excess adhesive is small, the adhesive retaining groove 4 just needs to be formed along one of side edges of the bonding surface. Moreover, FIG. 3B shows an ultrasonic probe in which a chamfered surface 7 is also formed on both side edges of the first surface of the flexible auxiliary member (thin backing material) 2 formed of a backing material so as to form the adhesive retaining groove 4 in combination with the chamfered surface 5 of the main backing material 3. By also inclining the upper ceiling by chamfering the side edges of the first surface of the thin backing material 2, the volumetric capacity of the adhesive retaining groove 4 can be further increased, or the degradation of the sound attenuating capability can be prevented when shallowing the groove even with the equal volumetric capacity. In addition, similarly to the variation as shown in FIG. 3A, the adhesive retaining groove 4 may be formed along one of side edges of the bonding surface.

Figure 4:
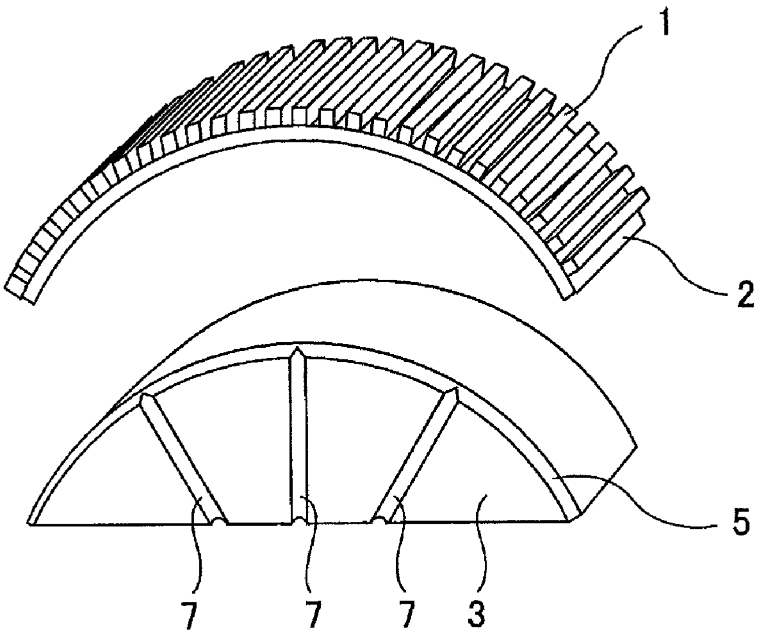
FIG. 4 is an assembly view of an ultrasonic probe according to a second embodiment of the present invention.
Figure 5:
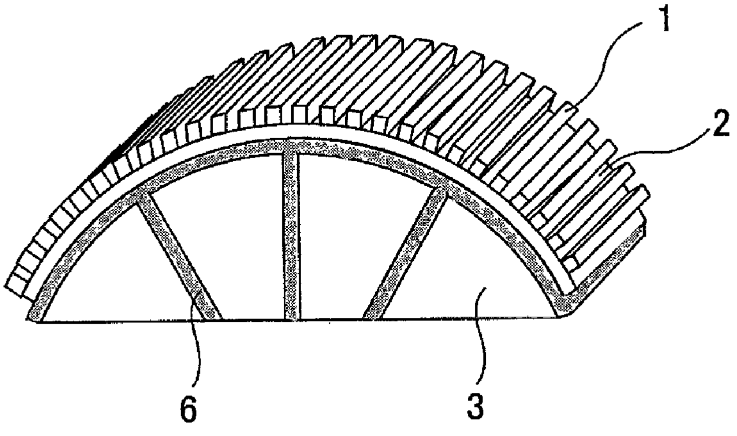
FIG. 5 is a perspective view showing an internal structure of the ultrasonic probe according to the second embodiment of the present invention.

FIG. 4 is an assembly view of an ultrasonic probe according to a second embodiment of the present invention, and FIG. 5 is a perspective view showing an internal structure of the ultrasonic probe according to the second embodiment of the present invention.

In the ultrasonic probe according to this embodiment, at least one adhesive retaining groove is formed by the chamfered surface 5 in the ridge line portion of the curved surface of the main backing material 3, and at least one drain ditch 7 is formed on at least one of side faces of the main backing material 3 in the direction normal to the curved surface. The drain ditch 7 is connected to the adhesive retaining groove formed by the chamfered surface 5. The adhesive 6 overflowing from the adhesive retaining groove formed by the chamfered surface 5 flows and spreads into the drain ditch 7, and is solidified within the drain ditch 7. This can prevent the excess adhesive 6 from overflowing to the piezoelectric element 1 side. Since the drain ditch 7 extends in the direction normal to the bonding surface, the position and direction of the drain ditch 7 deviate from the vibration position and vibration direction of the piezoelectric element 1, and thus, the drain ditch 7 does not have a significant affect on the performance of the piezoelectric element 1 in transmission and reception of the ultrasonic waves.

Figure 6:
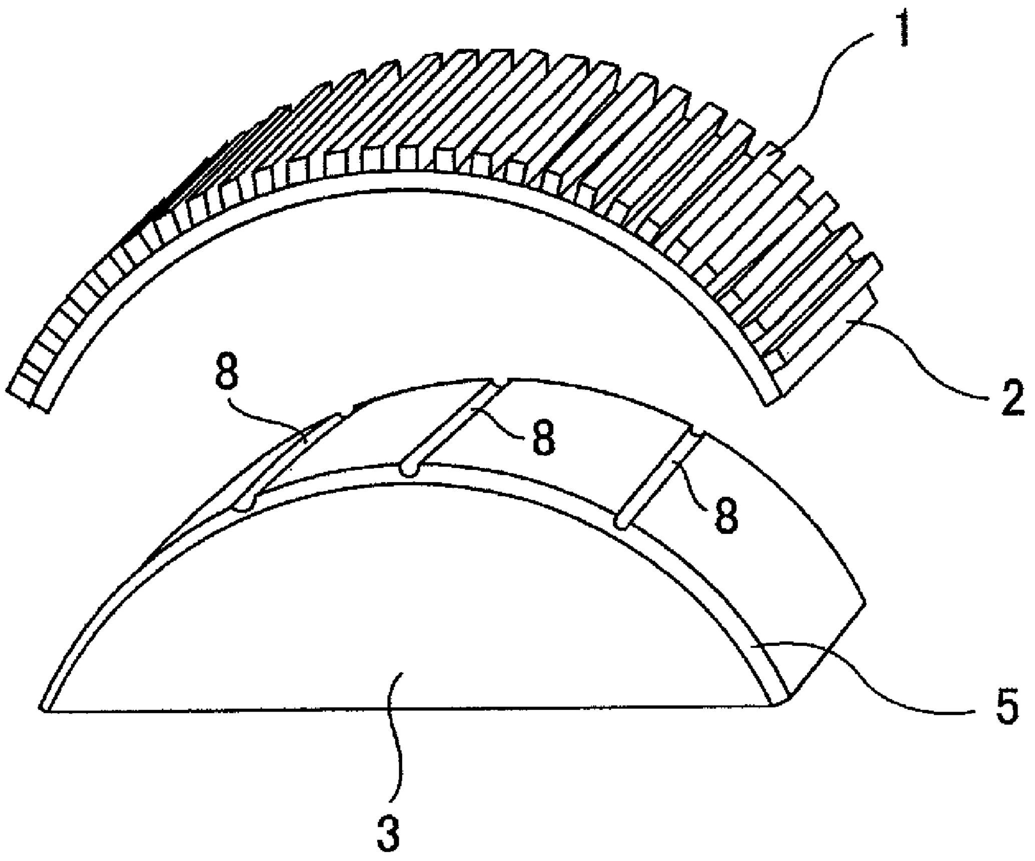
FIG. 6 is an assembly view of an ultrasonic probe according to a third embodiment of the present invention.
Figure 7:
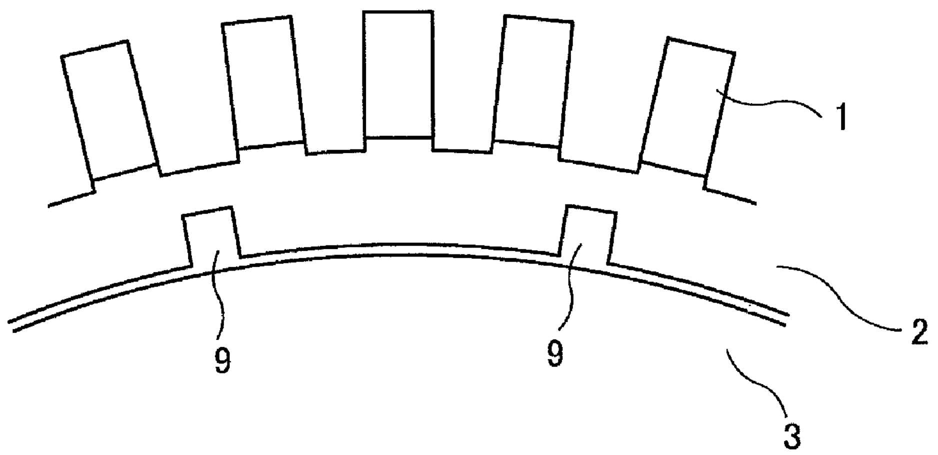
FIG. 7 is a partial enlarged side view of an ultrasonic probe according to a variation of the third embodiment of the present invention.
Figure 8:
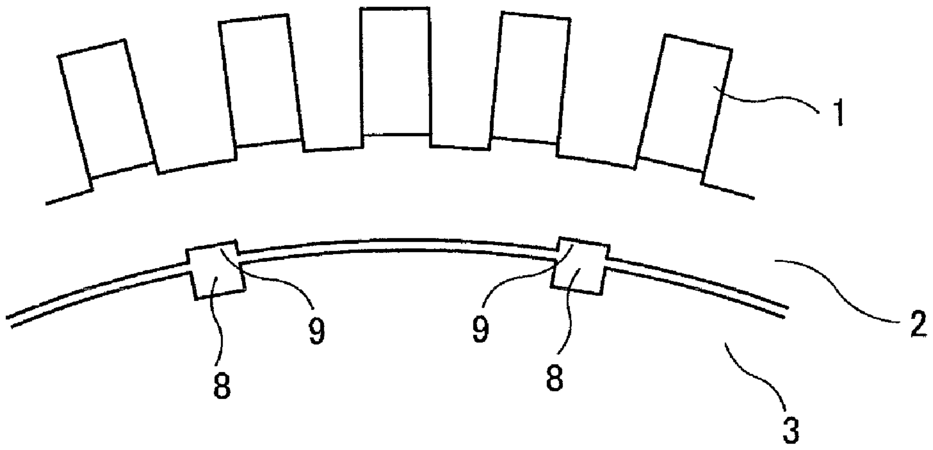
FIG. 8 is a partial enlarged side view of an ultrasonic probe according to another variation of the third embodiment of the present invention.

FIG. 6 is an assembly view of an ultrasonic probe according to a third embodiment of the present invention, and FIGS. 7 and 8 are partial enlarged side views of an ultrasonic probe according to variations of the third embodiment.

In the ultrasonic probe according to this embodiment, at least one adhesive retaining groove is formed by the chamfered surface 5 in the ridge line portion of the curved surface of the main backing material 3, and at least one slot is formed by at least one groove 8 in the curved surface of the main backing material 3. The groove 8 is arranged underneath a portion where the piezoelectric element 1 is not present, i.e., in a portion that does not locate at the back of the piezoelectric element 1, so as to avoid the portion directly under the piezoelectric element 1.

Here, preferably, the groove 8 has a width equal to or less than an interval of the piezoelectric elements 1 in the azimuth direction of the piezoelectric elements 1 and extends in the elevation direction of the piezoelectric elements 1. By putting a mark for clarifying the groove position in advance at the back side of the thin backing material 2 when separating a tabular piezoelectric element into an array of piezoelectric elements by cutting the tabular piezoelectric element and upper portions of the thin backing material 2, then the alignment becomes easy in bonding the thin backing material 2 and the main backing material 3 to each other.

The groove 8 is connected to at least one adhesive retaining groove formed by the chamfered surface 5 in at least one ridge line portion of the curved surface of the main backing material 3. The adhesive protruding from the bonding surface flows and enters the groove 8 in the bonding surface. The adhesive having filled the groove 8 and overflowed therefrom flows into the adhesive retaining groove formed by the chamfered surface 5, and is solidified therein. Since the sound attenuation capability of the adhesive is small as compared with that of the backing material, the adhesive that is present directly under the piezoelectric element will degrade the performance of the ultrasonic probe. However, as in this embodiment, the arrangement of the groove 8 in a portion where the piezoelectric element 1 is not present will not degrade the performance of the ultrasonic probe.

Further, as shown in FIG. 7, in place of the groove 8 formed in the curved surface of the main backing material 3, at least one slot for receiving the adhesive may be formed by at least one groove 9 formed in the first surface of the thin backing material 2 facing the main backing material 3, and the same effect can be obtained. The piezoelectric material layer with at least the lower electrode layer thereof coated is bonded onto the thin backing material 2, and thereafter, the individual piezoelectric element 1 is separated by forming grooves into the piezoelectric material layer by using a dicing saw. At this time, the grooves are formed also in the second surface of the thin backing material 2. Accordingly, in this embodiment, the grooves are formed in the first and second surfaces of the thin backing material 2, and therefore, the flexibility of the thin backing material 2 is improved and the workability when bonding the thin backing material 2 onto the curved surface of the main backing material 3 is improved significantly.

Moreover, as shown in FIG. 8, the slot for receiving the adhesive may be formed by aligning the groove 8 formed in the curved surface of the main backing material 3 with the groove 9 formed in the first surface of the thin backing material 2. In manufacturing an ultrasonic probe having such a structure, the alignment can be made easily and precisely by using an appropriate jig at the time of assembly.

Figure 9:
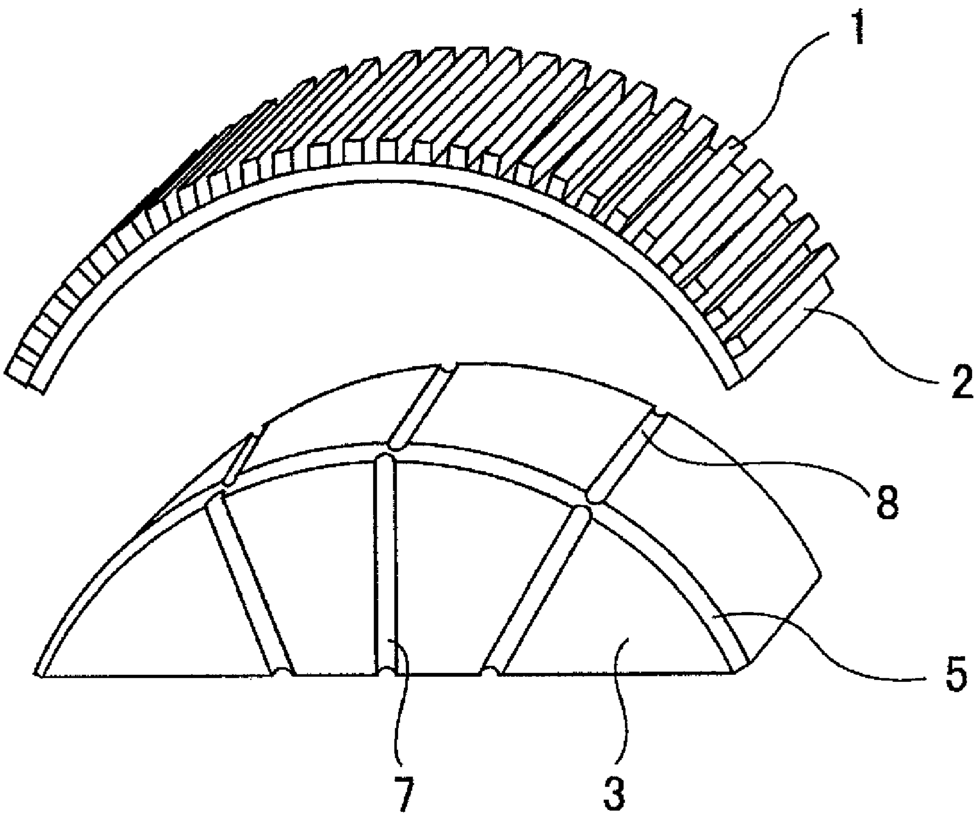
FIG. 9 is an assembly view of an ultrasonic probe according to a fourth embodiment of the present invention.

FIG. 9 is an assembly view of an ultrasonic probe according to a fourth embodiment of the present invention.

In the ultrasonic probe according to this embodiment, at least one adhesive retaining groove is formed by the chamfered surface 5 in the ridge line portion of the curved surface of the main backing material 3, and at least one groove extending in the elevation direction is formed in the bonding surface between the thin backing material 2 and the main backing material 3, and furthermore, at least one drain ditch 7 is formed in the direction normal to the bonding surface on the side face of the main backing material 3.

In FIG. 9, the groove 8 formed in the curved surface of the main backing material 3 is shown, however, in place of this or together with this, the groove 9 (see FIG. 7 or FIG. 8) may be formed in the first surface of the thin backing material 2. Since the adhesive retaining groove, the drain ditch 7, and the groove 8 or 9 in this embodiment respectively perform the same function as that of the embodiments already described, the excess-adhesive holding capacity of the ultrasonic probe of this embodiment obtained by combining these adhesive retaining groove, the drain ditch 7, and the groove 8 or 9 is sufficiently large, and therefore, bonding between the thin backing material 2 and the main backing material 3 can be reliably performed by using a sufficient amount of adhesive.

In each of the above-described embodiments, the main backing material has been described as a backing material formed by a part of the cylinder, however, the shape of the main backing material is not limited in particular as far as excess adhesive leaks out of the bonding surface, and the same function and effect can be obtained.

Figure 10A:
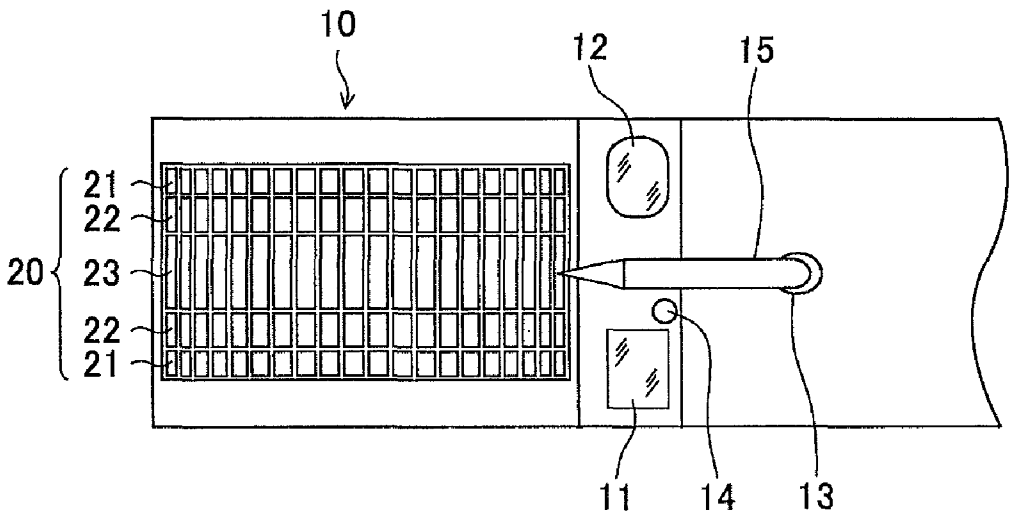
FIGS. 10A and 10B are views showing a tip part of an insertion portion of an ultrasonic endoscope as an application example of the ultrasonic probe according to each embodiment of the present invention.
Figure 10B:
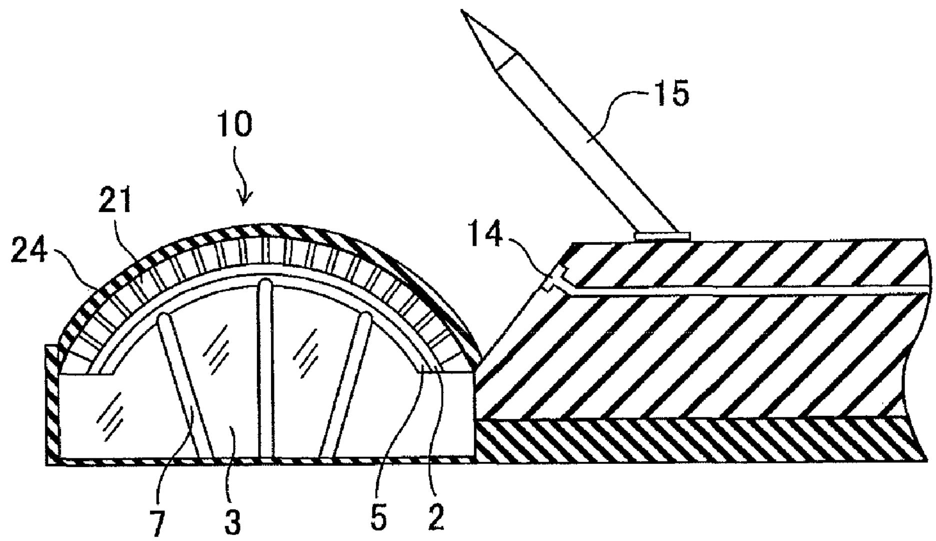
Figure 11:
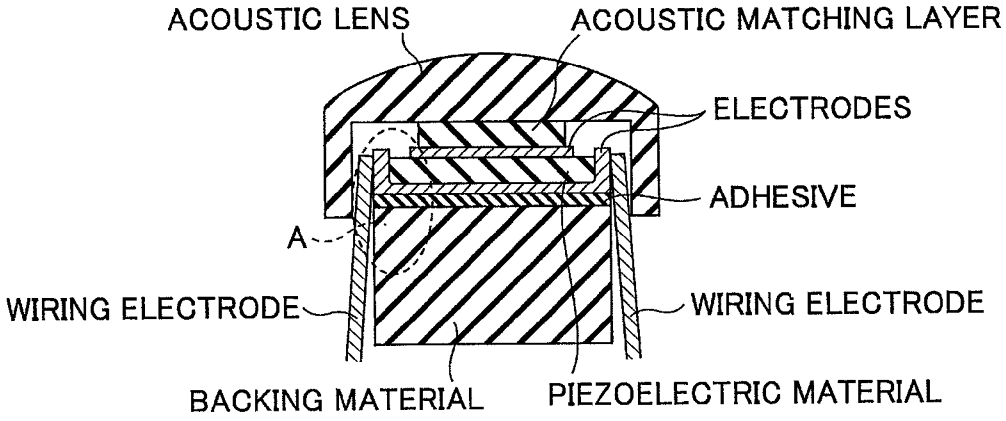
FIG.11 PRIOR ART
FIG. 11 is a cross sectional view showing an internal structure of a conventional ultrasonic probe.
Figure 12:
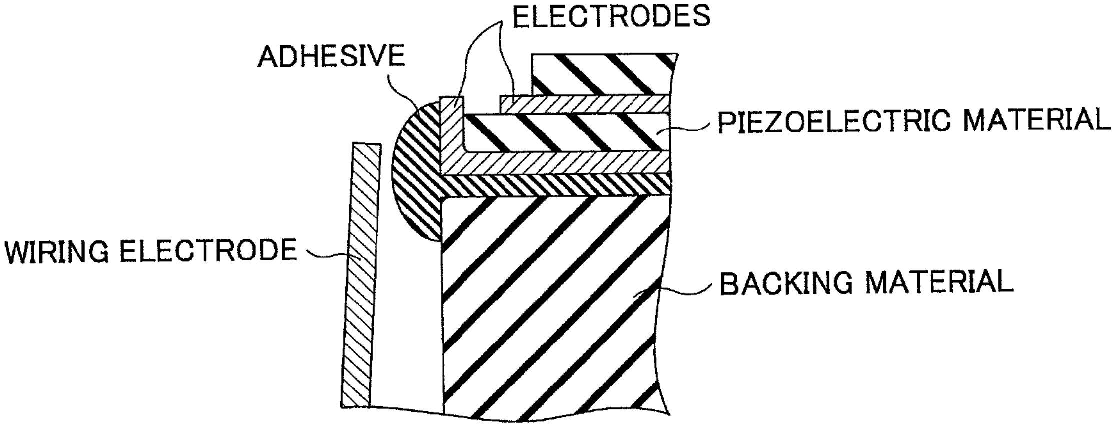
FIG.12 PRIOR ART
FIG. 12 is an enlarged view of a portion "A" in FIG. 11.
Figure 13:
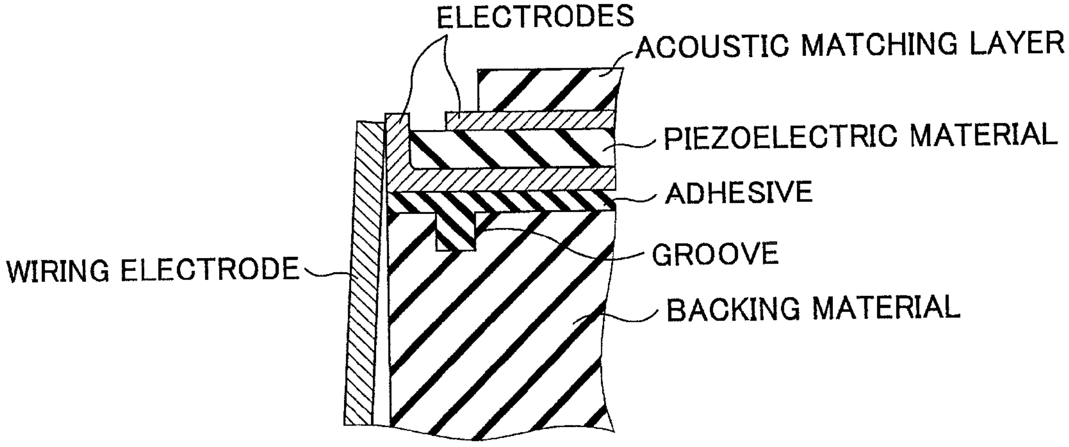
FIG.13 PRIOR ART
FIG. 13 is a cross sectional view showing an internal structure of an ultrasonic probe in which an adhesive retaining groove is formed by using a conventional technology.
Figure 14A:
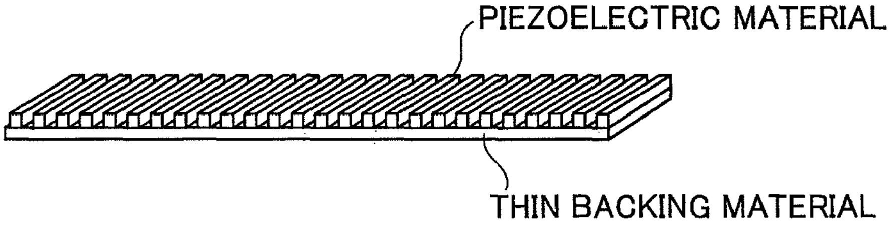
FIG.14A PRIOR ART
FIGS. 14A-14C are perspective views showing a manufacturing procedure of a conventional convex-type ultrasonic probe.
Figure 14B:
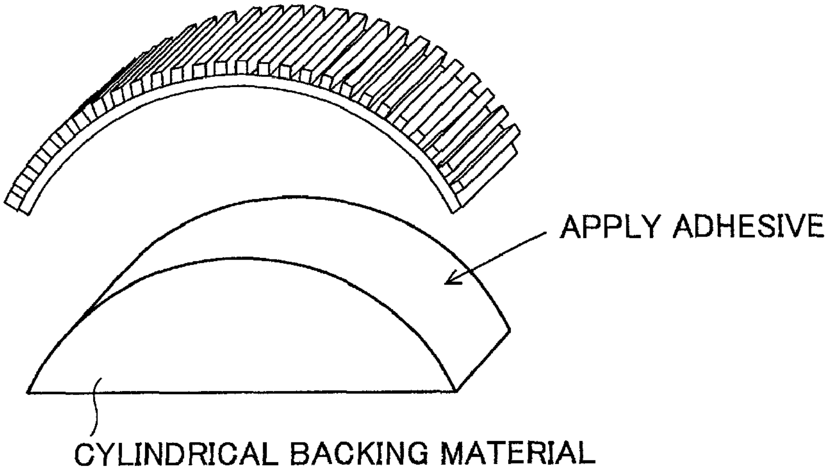
FIG.14B PRIOR ART
Figure 14C:
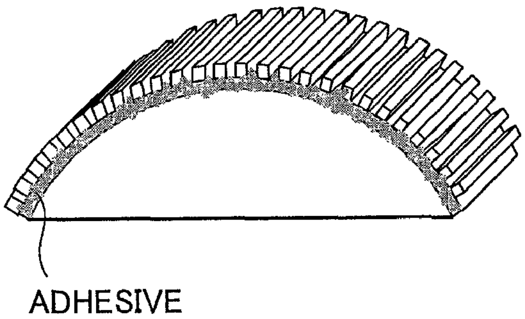
FIG.14C PRIOR ART
Figure 15:
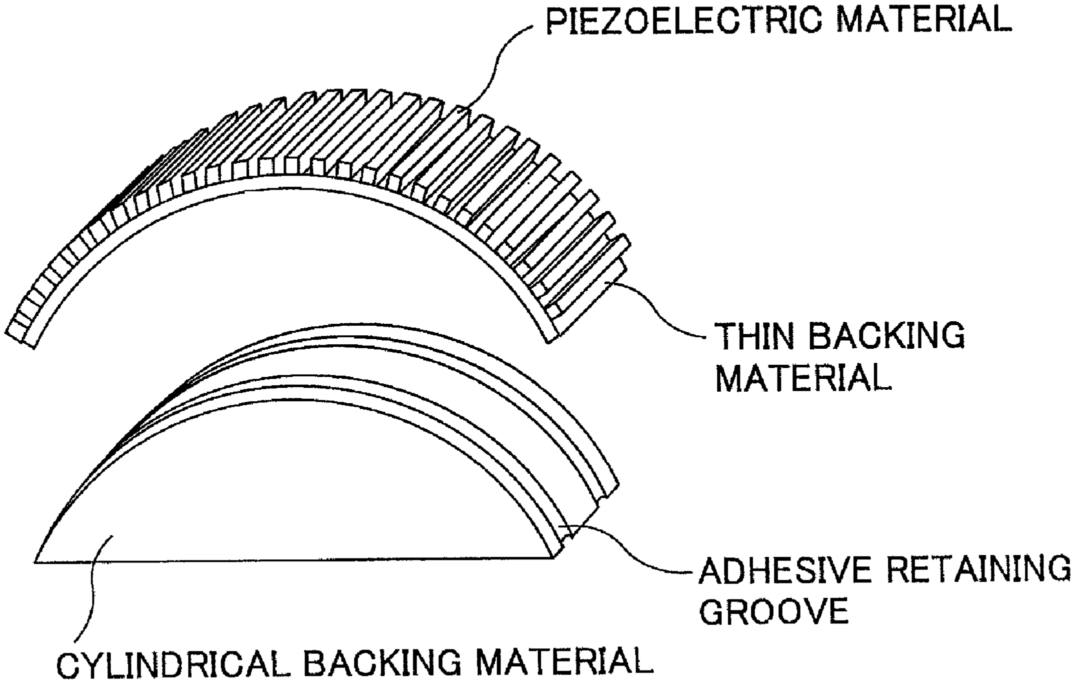
FIG.15 PRIOR ART
FIG. 15 is an assembly view of a convex-type ultrasonic probe in which an adhesive retaining groove is formed by a conventional technology.
Figure 16:
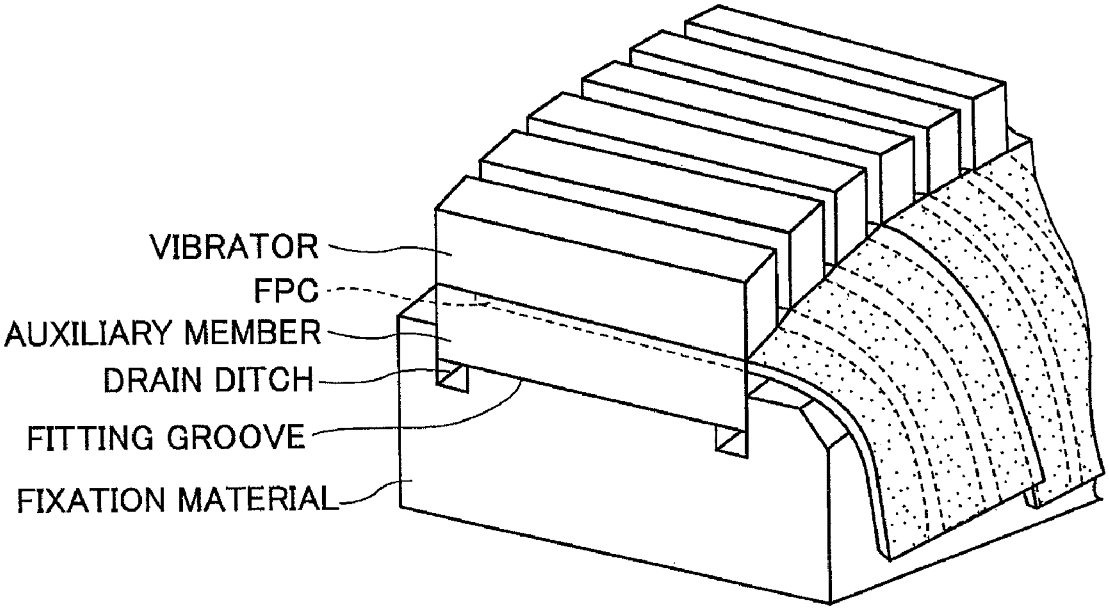
FIG.16 PRIOR ART
FIG. 16 is a perspective view showing an internal structure of a conventional ultrasonic probe.

FIGS. 10A and 10B are views showing a tip part of an insertion portion of an ultrasonic endoscope having an ultrasonic probe incorporated therein, as an example in which the ultrasonic probe according to each embodiment of the present invention is applied. The ultrasonic endoscope is an apparatus in which an ultrasonic probe is provided at a tip of an insertion portion of an endoscopy device for optically observing the interior of an abdominal cavity of an object to be inspected. FIG. 10A is a plan view showing the upper surface of the tip part of the insertion portion, and FIG. 10B is a partial cross sectional view showing the side face of the tip part of the insertion portion. In FIG. 10A, an acoustic matching layer as shown in FIG. 10B is omitted.

As shown in FIGS. 10A and 10B, at the tip part of the thin and flexible insertion portion, there are provided an ultrasonic probe 10, an observation window 11, an illumination window 12, a treatment tool insertion opening 13, and a nozzle hole 14. A puncture needle 15 is arranged in the treatment tool insertion opening 13. In FIG. 10A, an objective lens is fit in the observation window 11, and a solid-state image sensor such as an input end of an image guide or a CCD camera is arranged at the focusing position of the objective lens. These configure observation optics. Furthermore, an illumination lens for outputting illumination light to be supplied from a light source unit via a light guide is fit in the illumination window 12. These configure illumination optics.

The treatment tool insertion opening 13 is a hole for guiding out a treatment tool or the like inserted from the treatment tool insertion opening of an operation portion provided at the base end of the insertion portion. Various treatments are performed within an abdominal cavity of the object by projecting the treatment tool, such as the puncture needle 15 or forceps from the hole and manipulating this in the operation portion. The nozzle hole 14 is provided for injecting a liquid (water or the like) for cleaning the observation window 11 and the illumination window 12.

The ultrasonic probe 10 includes a convex-type vibrator array 20, and the vibrator array 20 includes a plurality of piezoelectric vibrators 21-23 arranged in one or more rows on the curved flexible auxiliary member 2. As shown in FIG. 10B, at least one acoustic matching layer 24 is arranged on the front face of the vibrator array 20. Above the acoustic matching layer 24, an acoustic lens is arranged according to need. Moreover, the main backing material 3 is arranged on the back face of the flexible auxiliary member 2.

The chamfered surface 5 as described in the first embodiment of the present invention and the drain ditch 7 as described in the second embodiment of the present invention are formed in the main backing material 3. Furthermore, as described in the third embodiment of the present invention, the groove 8 (FIG. 6) may be formed in the main backing material 3, or the groove 9 (FIG. 7) may be formed in the flexible auxiliary member 2.

In the case where a piezoelectric ceramic is used as the piezoelectric material, there is a large difference between the acoustic impedance of the piezoelectric ceramic and the acoustic impedance of an object to be inspected (human body or the like). It is therefore necessary to achieve acoustic impedance matching by arranging on the front face of the vibrators 21-23, the acoustic matching layer 24 having an intermediate acoustic impedance between these impedances, so as to increase the propagation efficiency of ultrasonic waves. When the acoustic matching layer has a two-layer structure, as the material of a first acoustic matching layer, for example, a material obtained by mixing material powder (zirconia, tungsten, or ferrite powder, or the like) having a high acoustic impedance into quartz glass or an organic material (an epoxy resin, a urethane resin, silicon resin, an acrylate resin, or the like) can be used. As the material of a second acoustic matching layer, for example, an organic material (an epoxy resin, a urethane resin, silicon resin, an acrylate resin, or the like) can be used.

In FIGS. 10A and 10B, a convex-type vibrator array is shown as the vibrator array, however, a radial-type vibrator array in which a plurality of vibrators are arranged on a cylindrical plane, or a vibrator array in which a plurality of vibrators is arranged on a spherical surface may be used. The insertion portion of the ultrasonic endoscope includes an elongated tube having flexibility with an outer diameter of several millimeters, and the constituent elements such as the ultrasonic probe need to be formed in a very small size to such an extent to fit within this tube. The present invention is particularly effective in such cases.

The invention claimed is:

1. An ultrasonic probe comprising:

a main backing material having a curved surface;

a flexible auxiliary member having a first surface bonded onto the curved surface of said main backing material by using an adhesive; and an array of piezoelectric elements arranged on a second surface opposite to the first surface of said flexible auxiliary member, wherein at least one of side edges of a bonding surface between said flexible auxiliary member and said main backing material is formed with a recessed area for allowing the adhesive, which has protruded when bonding said flexible auxiliary member onto said main backing material by using the adhesive, to escape thereinto, and said recessed area is formed by a chamfered surface formed by chamfering at least one ridge line portion of said curved surface of said main backing material.

2. The ultrasonic probe according to claim 1, wherein at least one slot is formed in a portion, which is not located at a back of each piezoelectric element, in a bonding surface between said flexible auxiliary member and said main backing material such that an adhesive protruding from the bonding surface may enter the at least one slot.

3. The ultrasonic probe according to claim 2, wherein said at least one slot has a width not larger than an interval between said piezoelectric elements in an azimuth direction of said piezoelectric elements, and extends in an elevation direction of said piezoelectric elements.

4. The ultrasonic probe according to claim 2, wherein said at least one slot includes at least one groove formed in at least one of the curved surface of said main backing material and the first surface of said flexible auxiliary member.

5. An ultrasonic probe comprising:

a main backing material having a curved surface;

a flexible auxiliary member having a first surface bonded onto the curved surface of said main backing material by using an adhesive; and an array of piezoelectric elements arranged on a second surface opposite to the first surface of said flexible auxiliary member, wherein at least one of side edges of a bonding surface between said flexible auxiliary member and said main backing material is formed with a recessed area for allowing the adhesive, which has protruded when bonding said flexible auxiliary member onto said main backing material by using the adhesive, to escape thereinto, and at least one drain ditch connected to said recessed area is further formed in a side face of said main backing material so as to prevent an excess adhesive from overflowing to a side of said piezoelectric element.

6. The ultrasonic probe according to claim 5, wherein at least one slot is formed in a portion, which is not located at a back of each piezoelectric element, in a bonding surface between said flexible auxiliary member and said main backing material such that an adhesive protruding from the bonding surface may enter the at least one slot.

7. The ultrasonic probe according to claim 6, wherein said at least one slot has a width not larger than an interval between said piezoelectric elements in an azimuth direction of said piezoelectric elements, and extends in an elevation direction of said piezoelectric elements.

8. The ultrasonic probe according to claim 6, wherein said at least one slot includes at least one groove formed in at least one of the curved surface of said main backing material and the first surface of said flexible auxiliary member.

* * * * *